US006607953B2

United States Patent
DeBoer

(10) Patent No.: US 6,607,953 B2
(45) Date of Patent: Aug. 19, 2003

(54) STRUCTURAL INTEGRITY ENHANCEMENT OF DIELECTRIC FILMS

(75) Inventor: Scott J. DeBoer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/226,356

(22) Filed: Aug. 21, 2002

(65) Prior Publication Data

US 2002/0197816 A1 Dec. 26, 2002

Related U.S. Application Data

(60) Continuation of application No. 09/912,153, filed on Jul. 23, 2001, now Pat. No. 6,455,365, which is a division of application No. 09/191,156, filed on Nov. 12, 1998, now Pat. No. 6,340,613.

(51) Int. Cl.[7] ............................ H01L 21/8242
(52) U.S. Cl. .................. 438/240; 439/239; 439/762; 439/786; 439/787
(58) Field of Search .................. 438/240, 239, 438/762, 786, 787

(56) References Cited

U.S. PATENT DOCUMENTS 6,037,219 A * 3/2000 Lin et al. ............... 438/255
6,340,613 B1 1/2002 DeBoer ................. 438/240

OTHER PUBLICATIONS

Chang et al., Rapid Thermal Oxidation of Thin Nitride/Oxide Stacked Layer, Appl. Phys. Lett., 54 (5), p. 430–2 (1989).*

Itoh et al., "Formation of High–Quality Oxide/Nitride Stacked Layers on Rugged Polysilicon Electrodes by Rapid Thermal Oxidation", IEEE Transactions on Electron Devices, vol. 40 (6), p. 1176–9 (1993).*

* cited by examiner

Primary Examiner—Kamand Cuneo
Assistant Examiner—Lisa Kilday

(57) ABSTRACT

An exemplary embodiment of the present invention discloses a method for forming a storage capacitor for a memory device, by the steps of: forming a bottom electrode of the storage capacitor over a BoroPhosphoSilicate Glass (BPSG) layer; forming a storage capacitor dielectric layer over the bottom electrode, the storage capacitor dielectric layer consisting of a nitride layer that is 50Å or less in thickness; exposing the nitride dielectric layer to heat during a first stage rapid thermal oxidation step at a first temperature range that is equal to or greater than a reflow temperature required to reflow the BPSG layer; exposing the nitride dielectric layer to wet oxidation during a second stage rapid thermal oxidation step, the second stage rapid thermal oxidation step is performed at a second temperature ranging from 810° C. to 1040° C. and for a time duration of less than three minutes and being sufficient to oxidize the nitride dielectric layer to prevent the diffusion of 90% of oxygen atoms through the nitride dielectric layer. The preferred wet oxidation is a steam ambient including a gas selected from the group consisting of $O_2/HCl$, $O_2/TLC$, $NO/HCl$, $NO/TLC$, $N_2O/TLC$ or $O_3$.

15 Claims, 2 Drawing Sheets

STRUCTURAL INTEGRITY ENHANCEMENT OF DIELECTRIC FILMS

This application is a continuation to U.S. patent application Ser. No. 09/912,153, filed Jul. 23, 2001 now U.S. Pat. No. 6,455,365 which is a divisional to U.S. patent application Ser. No. 09/191,156, filed Nov. 12, 1998, now U.S. Pat. No. 6,340,613 B1.

FIELD OF THE INVENTION

This invention relates to semiconductor fabrication processing and more particularly to a method for increasing the overall reliability of dielectric films used in semiconductor devices, such as dynamic random access memories (DRAMs).

BACKGROUND OF THE INVENTION

In the manufacturing of dynamic random access memories (DRAMs) the size of the memory cell is the main contributing factor to the density and overall size of the device. A manufacturer of DRAMs has motivation to increase the storage capability, while maintaining the smallest die size possible, as the smaller die size results in a lower cost per device. As mentioned, the main contributor to the size of a memory device is the amount of space required for each storage cell that makes up the storage array. In that regard, DRAM fabrication engineers have focused on storage cell structures, on materials to make the structures and on methods to fabricate the structures necessary to make a storage cell.

To save space, the capacitor of the storage cell must reduce in size and yet maintain adequate capacitance to retain a sufficient charge during DRAM operation. There are several approaches to the capacitor design, for example trench capacitors formed in the substrate of a wafer or a stacked capacitor formed above the wafer substrate, to name two. Regardless of the design chosen, there is a great incentive to minimize the physical size of the capacitor and yet maintain sufficient capacitance as mentioned previously. Two of the main contributors to capacitance are the surface area of the capacitor plates and the dielectric quality of the insulator separating the capacitor plates.

Major engineering efforts have gone into both of the areas. In regards to dielectric quality, thin film dielectrics having high dielectric constant characteristics have emerged as the dielectric of choice, as the thinnest film that can be placed between the capacitor plates that will prevent dielectric breakdown when a charge is present on the capacitor plates drastically increases capacitance. With increased capacitance, the overall size of the capacitor can be reduced. However, thin film dielectrics present some challenges in fabricating the complete storage cell structure, which includes a storage cell access transistor and a storage capacitor.

One of the thin dielectric films of choice is nitride (i.e., silicon nitride) as nitride possesses sufficient dielectric constant characteristics and can be deposited as a very thin layer (<100 Å). However a nitride film of this thickness must be conditioned is some manner to plug any pinholes in the film and thus maintain the dielectric integrity of the entire film. Therefore, new challenges to condition the thin film arise once a nitride film that is 50Å or less in thickness is desired. The present invention presents methods to successfully address these now challenges, as will become apparent to those skilled in the art from the following disclosure.

SUMMARY OF THE INVENTION

The present invention teaches a method for reducing the diffusing of oxygen atoms through a dielectric film during a semiconductor fabrication process. This method uses a thin dielectric layer that is of such thickness that may allow oxygen atoms to diffuse completely through it. Then the thin dielectric layer is exposed to a wet oxidation during a rapid thermal oxidation step. The rapid thermal oxidation step is performed at a temperature and time duration which are sufficient to oxidize the thin dielectric layer to prevent the diffusion of a majority of oxygen atoms through it, and at the same time maintain the dielectric integrity or original dielectric characteristics of the thin film.

One implementation of the present invention is to utilize a nitride dielectric layer that is 50 Å or less in thickness for the intended use as a storage capacitor dielectric. The nitride dielectric layer is exposed to wet oxidation during a rapid thermal oxidation step. This rapid thermal oxidation step is performed at a temperature range and a time duration which are sufficient to oxidize the nitride dielectric layer to prevent the diffusion of a majority of oxygen atoms through the nitride dielectric layer and to maintain the nitride layer's dielectric integrity.

A second implementation of the present invention comprises as two stage RTP process that is sufficient to oxidize nitride dielectric layer, to prevent the diffusion of a majority of oxygen atoms through the nitride dielectric layer, to effectively fill the pinholes for leakage current reduction and to maintain the dielectric integrity throughout the film by first forming weak spots (first stage) and then healing them (second stage). If a given process does not use a reflowable material underneath the nitride layer then the first stage oxidation step could be eliminated and only the second stage oxidation step be implemented.

This method provides a way to effectively utilize a thin dielectric film layer that is 50 Å or less in thickness as a storage capacitor dielectric which will possess sufficient dielectric characteristics to hold a required charge. This method can be applied to other devices that would benefit from the use of a thin dielectric film, such as a floating gate device, that operates by storing a charge.

DETAILED DESCRIPTION OF THE INVENTION

An exemplary implementation of the present invention is directed to a process for enhancing the integrity of dielectric films used in a semiconductor device as depicted in FIGS. 1-4.

The following exemplary implementation is in reference to the fabrication of dynamic random access memory (DRAM) device. While the concepts of the present invention are conducive to the fabrication of DRAMs, the concepts taught herein may be applied to other semiconductor devices that would likewise benefit from the use of a thin dielectric film that will substantially reduce the diffusion of oxygen atoms through the thin dielectric film. Therefore, the depiction of the present invention in reference to the manufacture of a DRAM (the preferred embodiment), is not meant to limit the extent to which one skilled in the art might apply the concepts taught hereinafter.

Figure 1:
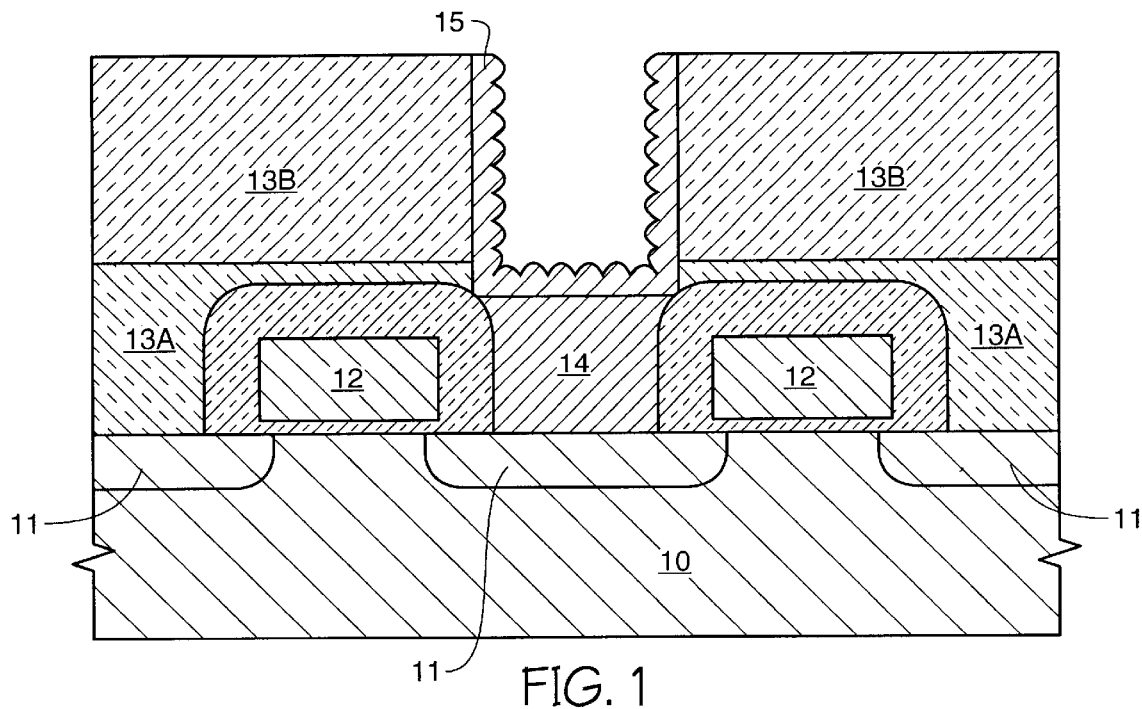
FIG. 1 is a cross-sectional view depicting a semiconductor substrate comprising portions of a memory storage cell having a storage cell access transistor and a bottom electrode for a storage capacitor.

Referring to FIG 1, a semiconductive substrate 10, such as a silicon water, is prepared for the processing steps of the present invention. Transistor gate conductors (word lines) 12 and the transistor diffusion regions 11 are formed by conventional DRAM fabrication methods. A material 13a and 13b, such as one that may be reflowed at an elevated temperature (reflow temperature) is footed over implanted source and drain regions 11 and word lines 12. In one exemplary implementation, material 13a and 13b is a reflowable glass, such as BoroPhosphoSilicate Glass (BPSG). The given process used will set the temperature at which the BPSG is originally placed (For the sake of this discussion the temperature to place the BPSG is defined as the "initial process temperature.") A cavity is patterned and etched into material 13a to receive conductive plug 14, such as metal or conducively doped polysilicon. BPSG (material 13a and 13b) is then deposited and densified. A contact hole is etched in BPSG material 13b to form a cavity down to plug 14 that is lined with material 15. In this cavity, material 15, a conductive material such as a conductively doped polysilicon or hemispherical-grained (HSG) silicon, is deposited and patterned to form a bottom plate of a storage capacitor.

Figure 2:
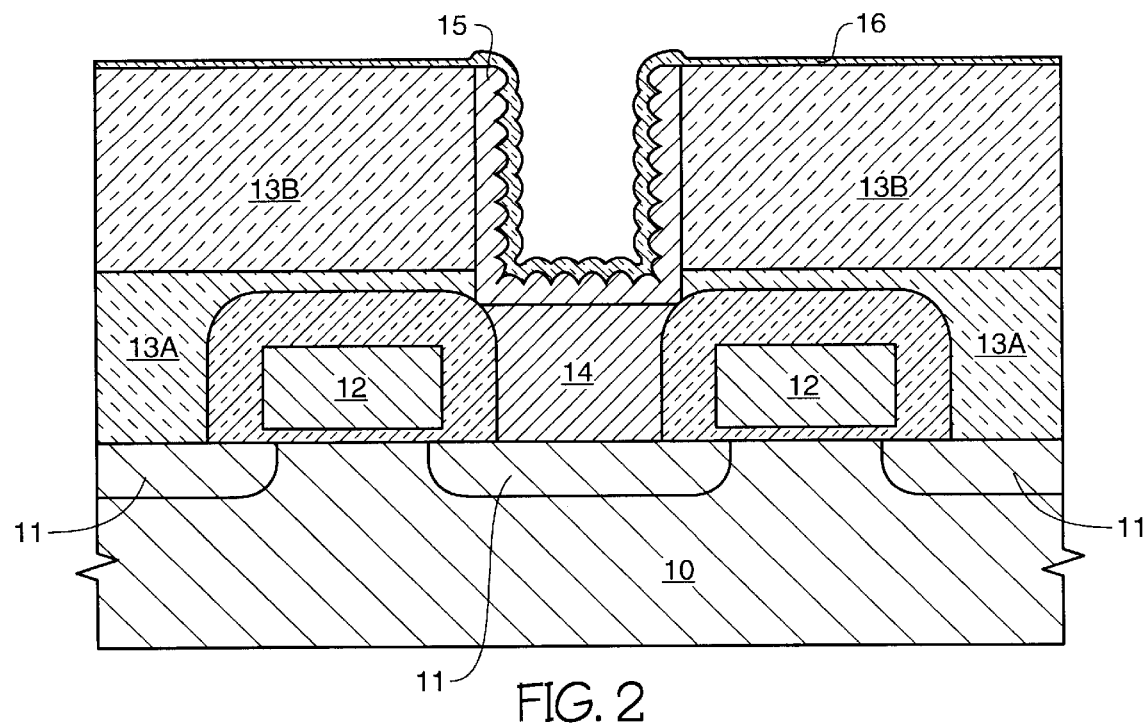
FIG. 2 is a subsequent cross-sectional view taken from FIG. 1 after the formation of a thin dielectric material, being 50Å or less in thickness, over the bottom electrode and over a bordering material.

Referring to FIG. 2, a thin layer of dielectric material 16 that is 50 Å or less in thickness is formed to cover material layer 13b and conductive material 15. If the dielectric integrity of dielectric material 16 can be maintained at this thickness, the finished capacitor will possess enhanced capacitance. However, due to the nature of the deposition process, the thickness of layer 16 on top of layer 13b is typically less than 65% of its thickness on layer 15, as illustrated in FIG. 2. In some cases the deposition is actually selective to layer 15, meaning there is basically no deposition of the material (layer 16) on layer 13b, while there may be up to 50 Å of material (layer 16) deposited on layer 13.

The present invention provides a method to allow the use of 50 Å or less dielectric film. For example, in a preferred implementation, the thin dielectric material 16 is a layer of nitride that is deposited to a thickness of 50 Å, as illustrated in FIG. 2. Seen in FIG. 2, the thickness of portion of layer 16 on layer is approximately 65% thicker than the portion of layer 16 on layer 13b. However, when trying to utilize a thin 50 Å dielectric film for dielectric material 16 several issues must be addressed.

A 50 Å nitride does not provide a sufficient barrier to prevent oxygen atoms from diffusing through (known in the art as oxidation punchthrough) the nitride layer overlying BPSG material 13b. Oxidation punchthrough refers to the mechanism of atomic oxygen diffusing completely through the nitride film 16 and diffusing all the way through BPSG 13a and 13b allowing oxygen atoms to reach implanted regions 11. The oxygen diffusion results in oxidation of the implanted source/drain regions 11, of polysilicon plug 14 and on the outside edges of layer 15 that borders BPSG material 13b. Oxidation in these areas will lead to increased contact resistance due to the smaller contact area.

A thin nitride film, such as a film that is approximately 80-150 Å, would effectively prevent damaging oxidation punchthrough. However, nitride films inherently contain pinholes and dangling silicon bonds, which diminish the dielectric integrity of the entire film. Conventionally, in order to fill pinholes and to passify the dangling silicon bonds, the film is subjected to a wet oxidation ambient, at a moderate temperature (700-850° C.) for a prolonged period of time (20-90 minutes) while in an atmospheric furnace. This results in a leakage current reduction in the this dielectric film and a reliablity improvement.

Oxygen atom diffusion is worse for a low temperature process due to the long processing time required, but because the dielectric film is thick enough to act as an effective barrier to the oxygen atoms, this approach works. Using a higher oxidation temperature (greater than 800° C.) will help to reduce the diffusion of oxygen atoms as the required oxidation growth will occur faster. However, using higher oxidation temperatures will cause other less desirable results.

A fundamental problem caused by using a higher oxidation temperature is that oxidation at a higher temperature and for an extended period of time will cause conductive dopants (typically arsenic, phosphorus and boron), present in the implanted regions of the underlying transistors, to diffuse into areas outside the intended implanted regions (which will adversely affect transistor characteristics). In addition to avoiding oxidation of underlying structures, a second obstacle to integrating dielectric films that are 50 Å or less in thickness is maintaining acceptable reliability. High temperature process steps following capacitor formation will cause the underlying BPSG layer to reflow in a manner similar to molten glass. Once this occurs, the overlying nitride layer is susceptible to damage due to the thinning nature of the nitride film directly the BPSG. The thin areas in the nitride film (weak spots) make the film prone to cracking after the BPSG has settled, which leads to reliability problems with the resulting capacitor.

As integrated circuit dimensions are reduced it becomes important to reduce the process temperature and time to limit diffusion of the dopants in the extremely small devices, Time constraints on the time for feature sizes less than 0.15u are extremely rigid. The process temperature for a batch furnace process must be less than 800° C. for proper transistor operation.

Therefore when dealing with a dielectric film that is 50 Å or less in thickness, a typical method of using a low oxidation temperature (less than 800° C.) is not feasible due to the tendency for massive oxidation of the underlying doped layers previously mentioned and due to the formation of weak spots in the thin dielectric resulting from the high temperature (typically greater than 900° C.) required for post capacitor formation for dopant activation and BPSG reflow. Also, raising the temperature in a conventional furnace above 800° C. results in excess dopant diffusion, due to the inherently large thermal budget of such a process. For processes with the minimum feature sizes less than 0.2u the amount of time spent at elevated temperatures must be minimized. In order to maintain dielectric integrity (maintaining high dielectric constant characteristics across the entire dielectric layer) an oxidation process is performed on dielectric material 16, in accordance with the present invention, that avoids the problems with oxidation of underlying structures and unwanted diffusion of conductive dopants from implanted regions, and which provides the required structure reliability.

Figure 3:
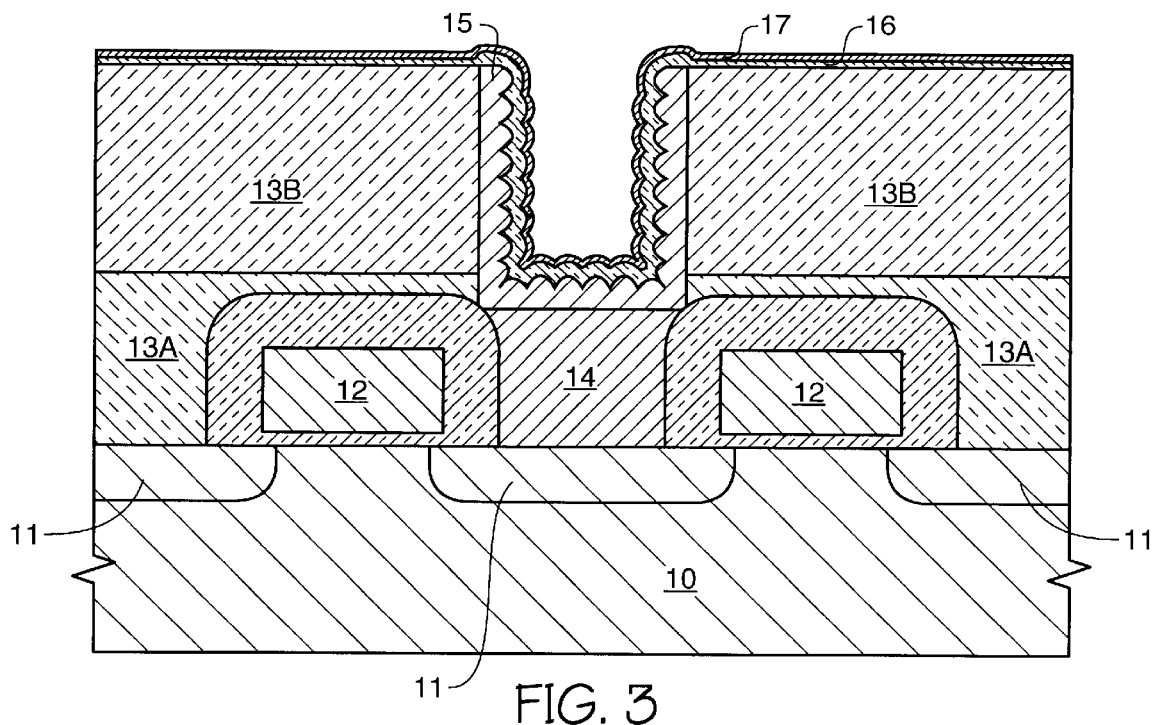
FIG. 3 is a subsequent cross-sectional view taken from FIG. 2 following oxidation of the thin dielectric material.

Referring to FIG. 3, the structure of FIG. 2 is subjected to an oxidation process that is different than the typical oxidation technique used on thicker dielectric layers (typically, 65 Å, or thicker nitride films). During the oxidation process, it is preferred that the dielectric material 16 (or nitride layer as in this example) is subjected to a first stage rapid thermal processing (RTP) oxidation step at an elevated temperature (equal to or greater than 850° C., greater than the initial process temperature and grater than the highest temperature that is required in the remaining process flow), for a time period of less than 60 seconds, in order to cause the underlying material 13, to reflow and stabilize. It is preferred that the first stage oxidation temperature be in the range of 850° C.-1050° C. and be at least 10° C. greater than highest temperature used in a given process. This high temperature will cause any weak spots in the overlying nitride film to form. It is preferred the initial oxidation step is preformed for approximately 20 seconds at 950° C. in order to provide extra margin in avoiding oxidation punchthrough. Due to the fact that an RTP system is being used, temperature ramp times do not play a significant part in the process and thus can be ignored.

Next, the temperature is reduced at a rate of greater than 30° C./second to subject the nitride film to wet oxidation during a second stage RTP oxidation step. The second stage RTP oxidation step is performed at a temperature that is at least 100° C. less than first stage oxidation temperature and that the second stage oxidation is conducted at temperature ranging from 810° C. to 1040° C. and for a time duration of less than three minutes. The steam can be obtained by any typical method (i.e., bubbled, pyrogenically ($H_2O_2$) or a catalytic method). It is preferred that the RTP wet oxidation step be performed at approximately 850° C. for less than 40 seconds. It is also preferred that the wet oxygen ambient (steam) include one of the following gases: $O_2$/HCl, $O_2$/TLC, NO/HCl, NO/TLC, $N_2O$/TLC or $O_3$. The advantage of using wet oxidation in a RTP oxidation step is the fact that the nitride film is sufficiently oxidized to form a high capacitance, low leakage oxynitride film while avoiding excessive thermal budget that would result from using a typical furnace to reach the needed elevated temperatures. It is important that the second stage RTP oxidation step is conducted at a temperature that is less than the temperature used in the initial oxidation step so that the underlying BPSG remains stable and the reliability of the capacitor structure is optimized. It is equally important that the second stage RTP oxidation step is performed at a temperature greater than 800° C. and be a wet oxidation step in order to obtain optimal electrical properties of the resulting film while avoiding oxidation of the underlying implanted layers and doped polysilicon structures.

Two typical Low Pressure Chemical Vapor Deposition (LPCVD) nitride deposition processes are a dichloral silane/ammonia (DCS/$NH_3$) based process and a tetrachloral silane/ammonia (TCS/$NH_3$) based process. These two processes may be used to deposit nitride on the surface of polysilicon bordered by BPSG. However, as described earlier, the resulting deposited nitride will be thinner over the BPSG surface than over the polysilicon. For example the DCS/$NH_3$ based process may deposit 50% less nitride or the BPSG than on the polysilicon. The TCS/$NH_3$ based process tends to deposit even less nitride film on the BPSG than on the polysilicon (possibly less than 20%). The present invention allows for the use of either deposition method as the thin nitride layer is sufficiently oxidized by the method of the present invention while avioding oxidation of the underlying implanted layers and doped polysilicon structures. It is preferred that the DCS/$NH_3$ based process be used.

This two stage RTP process is sufficient to oxidize nitride dielectric layer 16, to prevent the diffusion of 90% of oxygen atoms through the nitride dielectric layer, to effectively fill the pinholes for leakage current reduction and to maintain the dielectric integrity, throughout the film by first forming weak spots (first stage) and then healing them (second stage). The resulting oxidation is represented by oxidation layer 17 on a 50 Å thick nitride layer with the resulting thickness of oxidation layer 17 being less than 25 Å. If a given process does not use a reflowable material underneath the nitride layer then the first stage oxidation step could be eliminated and only the second stage oxidation step be implemented, which uses the wet oxidation process in a rapid thermal process system as previously described.

Figure 4:
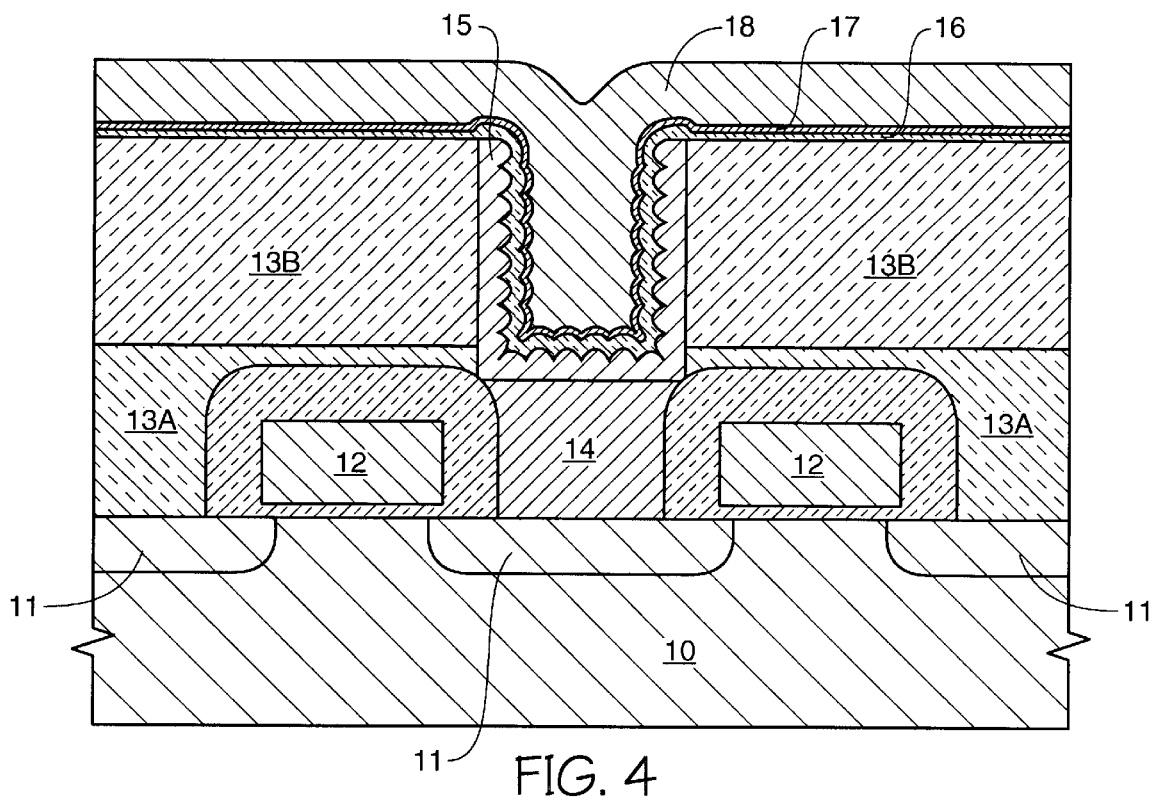
FIG. 4 is a subsequent cross-sectional view taken from FIG. 3 following the formation of a top electrode for the storage capacitor.

Referring to FIG. 4. a top storage capacitor electrode is fabricated by the formation of a conductive layer 18 to complete storage capacitor formation. From this point on the device is completed as dictated by the fabrication process used by those skilled in the art.

It is to be understood that although the present invention has been described with reference to several preferred embodiments, various modifications, known to those skilled in the art, may be made to the process steps presented herein without departing from the invention as recited in the several claims amended hereto.

What is claimed is:

1. A method for forming a storage capacitor for a memory device, said method comprising the steps of:
   forming a bottom electrode of said storage capacitor;
   forming a storage capacitor dielectric layer over said bottom electrode, said storage capacitor dielectric layer consisting of a nitride layer that is 50 Å or less in thickness;
   exposing said nitride layer to oxidation during a first stage rapid thermal oxidation step at a temperature of approximately 950° C. for approximately 20 seconds;
   exposing said nitride layer to wet oxidation during a second stage rapid thermal oxidation step, said second stage rapid thermal oxidation step performed at a temperature of approximately 850° C. and a time duration of less than 40 seconds;
   forming a top electrode of said storage capacitor over said storage capacitor dielectric layer.

2. The method of claim 1, wherein said wet oxidation is a steam ambient including a gas selected from the group consisting of $O_2$/HCl, $O_2$/TLC, NO/HCl, NO/TLC, $N_2O$/TLC and $O_3$.

3. The method as recited in claim 1, wherein said second stage rapid thermal oxidation step being sufficient to oxidize said nitride dielectric layer to prevent the diffusion of a majority of oxygen atoms through said nitride dielectric layer.

4. A method for fabricating a dielectric film in a semiconductor fabrication process, said method comprising the steps of:
   forming a nitride dielectric layer that is 50 Å or less in thickness over a structure comprising a film that will reflow when exposed to heat at a reflow temperature;
   exposing said nitride dielectric layer to heat using a first stage rapid thermal oxidation step at a first temperature of approximately 950° C. for approximately 20 seconds, said first temperature being equal to or greater than said reflow temperature;
   exposing said nitride dielectric layer to wet oxidation during a second stage rapid thermal oxidation step, said second stage rapid thermal oxidation step performed at a temperature of approximately 950° C. and a time duration of less than 40 seconds;

forming a top electrode of said storage capacitor over said storage capacitor dielectric layer.

5. The method of claim 4, wherein said wet oxidation is a steam ambient including a gas selected from the group consisting of $O_2$/HCl, $O_2$/TLC, NO/HCl, NO/TLC, $N_2O$/TLC and $O_3$.

6. The method as recited in claim 4, wherein said second stage rapid thermal oxidation step being sufficient to oxidize said nitride dielectric layer to prevent the diffusion of a majority of oxygen atoms through said nitride dielectric layer.

7. The method as recited in claim 4, wherein said step of exposing said nitride dielectric layer to heat at said first temperature comprises exposing said nitride dielectric layer to an oxygen ambient.

8. The method as recited in claim 4, wherein said step of exposing said nitride dielectric layer to heat at said first temperature comprises exposing said nitride dielectric layer to an nitrogen ambient.

9. A method for forming a storage capacitor for a memory device, said method comprising the steps of:

forming a bottom electrode of said storage capacitor over a BoroPhosphoSilicate Glass (BPSG) layer;

forming a storage capacitor dielectric layer over said bottom electrode, said storage capacitor dielectric layer consisting of a nitride layer that is 50 Å or less in thickness;

exposing said nitride dielectric layer to heat using a first stage rapid thermal oxidation step at a first temperature of approximately 950° C. or greater for approximately 20 seconds and that is equal to or greater than a reflow temperature required to reflow said BPSG layer;

exposing said nitride dielectric layer to wet oxidation during a rapid thermal oxidation step, said rapid thermal oxidation step performed at a second temperature of approximately 850° and a time duration of less than 40 seconds;

forming a top electrode of said storage capacitor over said storage capacitor dielectric layer.

10. The method of claim 9, wherein said wet oxidation is a steam ambient including a gas selected from the group consisting of $O_2$/HCl, $O_2$/TLC, NO/HCl, NO/TLC, $N_2O$/TLC and $O_3$.

11. The method as recited in claim 9, wherein said second stage rapid thermal oxidation step being sufficient to oxidize said nitride dielectric layer to prevent the diffusion of a majority of oxygen atoms through said nitride dielectric layer.

12. A method for forming a storage capacitor dielectric for a memory device, said method comprising the steps of:

forming BoroPhosphoSilicate Glass (BPSG) layer over a semiconductor assembly at an initial process temperature;

forming a bottom electrode of said storage capacitor over a BoroPhosphoSilicate Glass (BPSG) layer;

forming a storage capacitor dielectric layer over said bottom electrode, said storage capacitor dielectric layer consisting of a nitride layer that is 50 Å or less in thickness;

exposing said nitride dielectric layer to heat using a first stage rapid thermal oxidation step at a first stage temperature of approximately 950° C. for approximately 20 seconds and that is greater than said initial process temperature and greater than any remaining temperature used in said method;

exposing said nitride dielectric layer to wet oxidation during a rapid thermal oxidation step, said rapid thermal oxidation step performed at a second stage temperature of approximately 850° C. for less than 40 seconds;

forming a top electrode of said storage capacitor over said storage capacitor dielectric layer.

13. The method of claim 12, wherein said wet oxidation is a steam ambient including a gas selected from the group consisting of $O_2$/HCl, $O_2$/TLC, NO/HCl, NO/TLC, $N_2O$/TLC and $O_3$.

14. The method as recited in claim 12, wherein said step of forming a storage capacitor dielectric layer comprises a dichloral silane/ammonia (DCS/$NH_3$) based process.

15. The method as recited in claim 12, wherein said step of forming a storage capacitor dielectric layer comprises a tetrachloral silane/ammonia (TCS/$NH_3$) based process.

* * * * *

UNITED STATES PATENT AND TRADEMARK OFFICE
CERTIFICATE OF CORRECTION

PATENT NO.   : 6,607,953 B2  Page 1 of 1
DATED        : August 19, 2003
INVENTOR(S)  : Scott J. DeBoer It is certified that error appears in the above-identified patent and that said Letters Patent is hereby corrected as shown below:

Column 1,
Line 62, please replace "address these now" with -- address these new --

Column 3,
Line 9, please replace "silicon water," with -- silicon wafer, --
Line 14, please replace "is footed" with -- is formed --
Line 23, please replace "or conducively" with -- or conductively --
Line 42, please replace "deposited on layer 13." with -- deposited on layer 15. --
Line 48, please replace "on layer is" with -- on layer 15 is --

Column 4,
Line 7, please replace "reduction in the this" with -- reduction in the thin --
Line 8, please replace "film and a reliablity" with -- film and a reliability --
Line 38, please replace "extremely small devices," with -- extremely small devices. --
Line 39, please replace "Time constraints" with -- The constraints --
Line 54, please replace "less than 0.2u the" with -- less than 0.2u, the --

Column 5,
Line 6, please replace "and grater than" with -- and greater than --
Line 24, please replace "least 100ºC. less" with -- least 10ºC. less --
Line 57, please replace "nitride or the" with -- nitride on the --
Line 63, please replace "while avioding oxidation" with -- while avoiding oxidation --

Column 6,
Line 23, please replace "claims amended hereto" with -- claims appended hereto --

Signed and Sealed this

Twenty-third Day of December, 2003

JAMES E. ROGAN
*Director of the United States Patent and Trademark Office*